United States Patent
Yokoyama et al.

(10) Patent No.: US 9,370,994 B2
(45) Date of Patent: Jun. 21, 2016

(54) INTEGRATED POWER ELECTRIC UNIT MOUNTED ON ELECTRIC VEHICLE

(71) Applicant: NISSAN MOTOR CO., LTD., Yokohama-shi, Kanagawa (JP)

(72) Inventors: Nobuaki Yokoyama, Yokohama (JP); Tomoki Kawamura, Zama (JP); Tatsuya Shindou, Atsugi (JP); Takenari Okuyama, Zama (JP); Takeo Ishizaki, Fujisawa (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 0 days.

(21) Appl. No.: 14/423,275

(22) PCT Filed: Jul. 8, 2013

(86) PCT No.: PCT/JP2013/068610
§ 371 (c)(1),
(2) Date: Feb. 23, 2015

(87) PCT Pub. No.: WO2014/030445
PCT Pub. Date: Feb. 27, 2014

(65) Prior Publication Data
US 2015/0210157 A1    Jul. 30, 2015

(30) Foreign Application Priority Data

Aug. 24, 2012  (JP) ................................. 2012-185210

(51) Int. Cl.
*B60K 11/06* (2006.01)
*B60L 3/00* (2006.01)
(Continued)

(52) U.S. Cl.
CPC . *B60K 11/06* (2013.01); *B60K 1/00* (2013.01); *B60K 1/04* (2013.01); *B60L 3/00* (2013.01);
(Continued)

(58) Field of Classification Search
CPC .............. Y02T 10/642; Y02T 10/7216; Y02T 10/7241; B60L 3/00; B60L 3/003; B60L 11/1803; B60L 3/0061; B60L 2220/14; B60L 2210/10; B60L 2210/30; B60K 11/02–11/08; B60K 2001/008; B60K 1/00; B60K 2001/003; B60K 1/04; H02K 11/33; H01L 23/473
USPC .................. 165/80.4–80.5, 104.33; 174/15.1, 174/547–548; 361/689, 699; 363/141, 144; 180/65.21
See application file for complete search history.

(56) References Cited

U.S. PATENT DOCUMENTS 6,201,365 B1 * 3/2001 Hara ........................ B60K 6/26 310/54
7,561,429 B2 * 7/2009 Yahata .................. H02M 7/003 165/104.33

(Continued)

FOREIGN PATENT DOCUMENTS

JP       8-65945 A      3/1996
JP    2001-327111 A    11/2001
(Continued)

*Primary Examiner* — Anthony Haughton
*Assistant Examiner* — Matt Dhillon
(74) *Attorney, Agent, or Firm* — Foley & Lardner LLP

(57) ABSTRACT

Disclosed is an integrated power electric unit mounted on an electric vehicle, comprising a first power electric unit, a second power electric unit arranged over the first power electric unit in a vertical direction of the vehicle, a channel that connects the first and second power electric units so as to flow the air, and a breather provided in the second power electric unit to cause inner and outer sides of the second power electric unit to communicate with each other.

7 Claims, 2 Drawing Sheets

(51) Int. Cl.
  *B60L 11/18*    (2006.01)
  *B60K 1/00*     (2006.01)
  *B60K 1/04*     (2006.01)
  *H02K 9/22*     (2006.01)
  *H05K 7/20*     (2006.01)
  *B60K 11/02*    (2006.01)
  *H02M 7/00*     (2006.01)

(52) U.S. Cl.
  CPC .............. *B60L 3/003* (2013.01); *B60L 3/0061* (2013.01); *B60L 11/1803* (2013.01); *H02K 9/22* (2013.01); *H02K 11/33* (2016.01); *H05K 7/20863* (2013.01); *B60K 11/02* (2013.01); *B60K 2001/003* (2013.01); *B60K 2001/006* (2013.01); *B60L 2210/10* (2013.01); *B60L 2210/30* (2013.01); *B60L 2220/14* (2013.01); *B60L 2240/36* (2013.01); *B60L 2240/425* (2013.01); *B60L 2240/525* (2013.01); *H02K 2205/09* (2013.01); *H02M 7/003* (2013.01); *H05K 7/20936* (2013.01); *Y02T 10/641* (2013.01); *Y02T 10/642* (2013.01); *Y02T 10/7005* (2013.01); *Y02T 10/7216* (2013.01); *Y02T 10/7241* (2013.01); *Y02T 90/16* (2013.01)

(56) References Cited

U.S. PATENT DOCUMENTS

| | | | | |
|---|---|---|---|---|
| 7,847,450 | B2 | 12/2010 | Kakuda et al. | |
| 7,974,101 | B2* | 7/2011 | Azuma | B60K 6/48 361/501 |
| 8,212,382 | B2* | 7/2012 | Nakatsu | H05K 7/20927 307/9.1 |
| 8,240,411 | B2* | 8/2012 | Nakatsu | B60L 11/00 180/65.21 |
| 8,422,244 | B2* | 4/2013 | Azuma | B60K 6/48 361/752 |
| 8,693,193 | B2* | 4/2014 | Ishibashi | H02M 7/003 361/688 |
| 8,780,557 | B2* | 7/2014 | Duppong | H05K 7/209 165/80.4 |
| 8,810,087 | B2* | 8/2014 | Dorr | H02K 9/10 310/59 |
| 9,000,553 | B2* | 4/2015 | Tokuyama | H05K 7/1432 257/499 |
| 9,030,822 | B2* | 5/2015 | Sharaf | H05K 7/20927 165/104.33 |
| 9,048,708 | B2* | 6/2015 | Cloran | H02K 5/10 |
| 2006/0092611 | A1* | 5/2006 | Beihoff | B60L 11/12 361/698 |
| 2007/0002594 | A1* | 1/2007 | Otsuka | H02M 7/003 363/37 |
| 2007/0165376 | A1* | 7/2007 | Bones | H01L 25/162 361/688 |
| 2008/0049477 | A1* | 2/2008 | Fujino | H02M 7/003 363/131 |
| 2009/0206709 | A1 | 8/2009 | Kakuda et al. | |
| 2010/0149757 | A1* | 6/2010 | Stengel | H01M 16/00 361/728 |
| 2013/0094269 | A1* | 4/2013 | Maeda | H02M 7/003 363/141 |
| 2013/0279114 | A1* | 10/2013 | Nishikimi | B60K 6/28 361/699 |
| 2014/0029200 | A1* | 1/2014 | Annacchino | H05K 7/20936 361/700 |
| 2014/0084719 | A1* | 3/2014 | Asakura | B60K 6/405 310/54 |

FOREIGN PATENT DOCUMENTS

| | | |
|---|---|---|
| JP | 2005-137116 A | 5/2005 |
| JP | 2009-201218 A | 9/2009 |
| JP | 2009-284700 A | 12/2009 |
| JP | 2010-260391 A | 11/2010 |
| JP | 2011-121429 A | 6/2011 |

* cited by examiner

INTEGRATED POWER ELECTRIC UNIT MOUNTED ON ELECTRIC VEHICLE

TECHNICAL FIELD

This invention relates to an integrated power electric unit mounted on an electric vehicle.

BACKGROUND ART

In the technique discussed in JP 2009-201218 A, a first breather is provided in a motor casing, and a second breather is provided in an inverter casing different from the motor casing. It is noted that the breather causes the inside and the outside of the casing to communicate with each other to reduce a pressure difference therebetween.

SUMMARY OF INVENTION

In this technique discussed in JP 2009-201218 A, since the breathers are provided in both the motor casing and the inverter casing, water may rush in from the breather of the motor casing when the motor casing positioned in a lower side of a vehicle is submerged in water.

This invention has been made in view of such problems of the prior art. The object of this invention is to provide an integrated power electric unit mounted on an electric vehicle capable of preventing inrush of water from the breather even in water submergence.

According to an aspect of this invention, there is provided an integrated power electric unit mounted on an electric vehicle, comprising a first power electric unit and a second power electric unit arranged over the first power electric unit in a vertical direction of the vehicle. In addition, the integrated power electric unit includes a channel connecting the first and second power electric units so as to flow the air and a breather provided in the second power electric unit to cause inner and outer sides of the second power electric unit to communicate with each other.

DESCRIPTION OF EMBODIMENTS

Hereinafter, embodiments of this invention will be described with reference to the accompanying drawings.

First Embodiment

Figure 1:
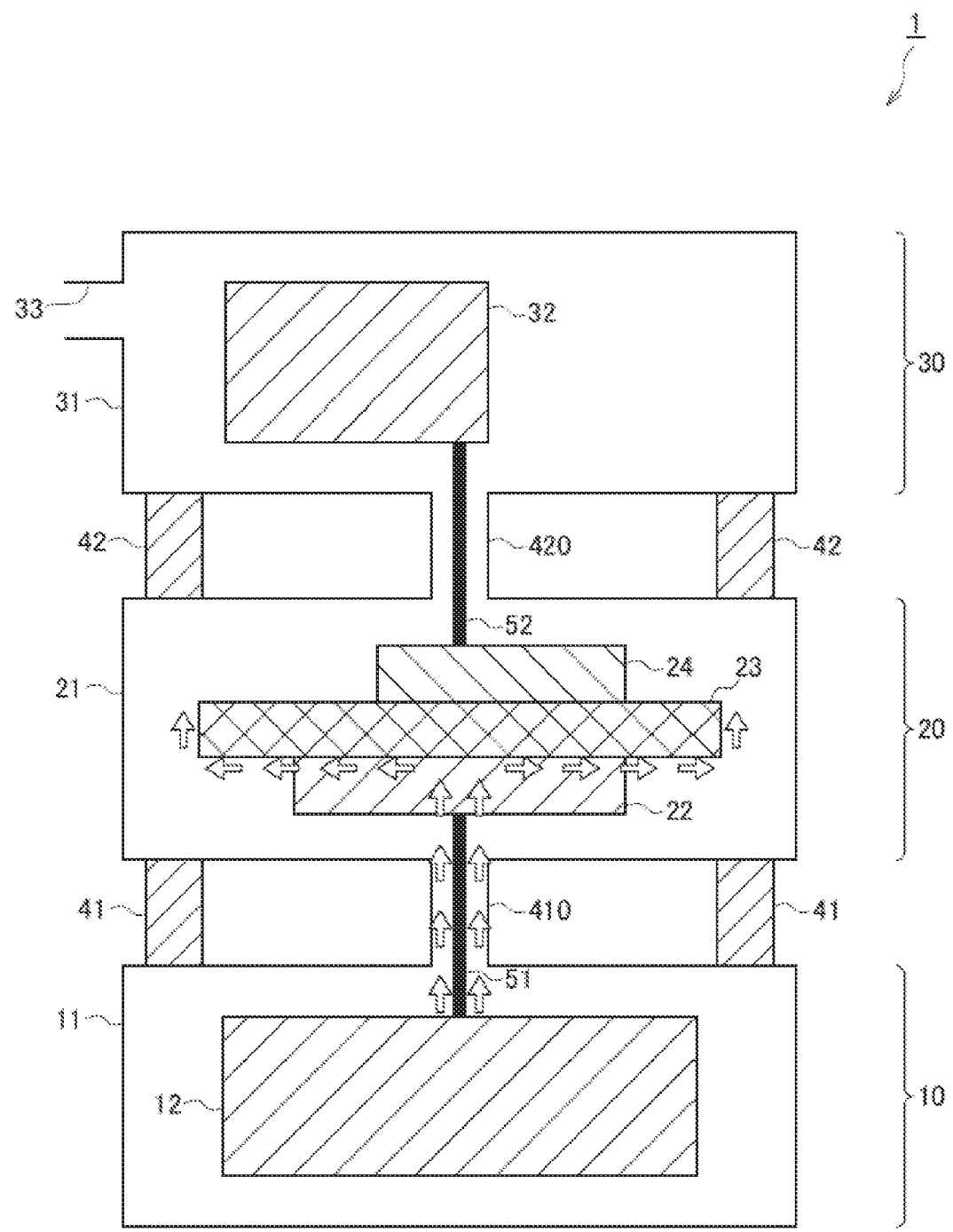
FIG. 1 is a schematic cross-sectional view illustrating an integrated power electric unit mounted on an electric vehicle according to a first embodiment.

FIG. 1 is a schematic cross-sectional view illustrating an integrated power electric unit mounted on an electric vehicle according to a first embodiment.

The integrated power electric unit 1 includes an electric motor 10, an inverter 20, and a power distribution module (PDM) 30.

The electric motor 10 is a power electric unit having a stator 12 and the like inside a motor casing 11. The electric motor 10 is, for example, a permanent magnet synchronous motor.

The inverter 20 is a power electric unit having a power module 22, a water cooling module 23, a smoothing capacitor 24, and the like in the inverter casing 21. The inverter 20 outputs a three-phase current. The power module 22 is connected to the stator 12 of the electric motor 10 through a three-phase current busbar 51 to supply driving electric power to the electric motor 10 or recover regenerative electric power from the electric motor 10. The water cooling module 23 is arranged on the power module 22. The water cooling module 23 cools the power module 22 using water. The smoothing capacitor 24 is arranged on the water cooling module 23. The inverter casing 21 is placed over the motor casing 11 by interposing a spacer 41. In addition, the inverter casing 21 communicates with the motor casing 11 through a hollow channel 410.

In addition, the power module 22, the water cooling module 23, and the smoothing capacitor 24 are arranged immediately over the channel 410.

The power distribution module (hereinafter, appropriately referred to as a "PDM") 30 is a power electric unit having a relay 32 or the like for electric power from a power battery (not illustrated) that supplies driving electric power in a PDM casing 31. In addition, the PDM 30 also has a DC/DC converter and an electric charger. The DC/DC converter serves as a voltage dropping circuit that drops a DC voltage from a driving battery (for example, battery of 350 V) (not illustrated) into a DC voltage to an auxiliary battery (for example, battery of 12 V). The electric charger serves as a conversion circuit that converts an AC current supplied from a household external AC power supply into a DC current to charge the driving battery. The PDM casing 31 is placed over the inverter casing 21 by interposing a spacer 42. In addition, the PDM casing 31 communicates with the inverter casing 21 through a hollow channel 420. Furthermore, the PDM casing 31 is provided with a breather 33. The breather 33 is a component that enables the air to flow between the inside and the outside of the PDM casing 31. The breather 33 may have, for example, a film pervious to a gas but not pervious to a liquid.

The three-phase current busbar 51 connected to the stator 12 of the electric motor 10 is connected to the power module 22 of the inverter 20 through the inside of the channel 410.

A PN busbar 52 connected to the smoothing capacitor 24 of the inverter 20 is connected to the relay 32 of the PDM 30 through the inside of the channel 420. In this structure, the electric power is supplied to the power module 22 of the inverter 20.

Next, functional effects of this embodiment will be described. It is conceived that a temperature of a unit having a lower mount position (for example, the electric motor 10 of FIG. 1) increases to a high temperature during operation. In this case, the internal air also has a high temperature. It is conceived that, if such a unit is submerged in water, the unit is cooled, so that both the internal temperature of the motor casing and the internal pressure decrease. In this case, if the motor casing is insufficiently sealed, water may rush in from a sealing portion due to a pressure difference between the inside and the outside of the motor casing. In addition, if every harness connected to the motor unit is not sealed in a watertight manner, water may rush in to the motor unit having a negative pressure through the inside of the harness. In this regard, according to this embodiment, the air can flow between the power electric units, and the breather 33 is provided in the PDM 30 having the highest mount position out of the power electric units. In this structure, the air inside the electric motor 10 communicates with the atmosphere through the channels 410 and 420 and the breather 33 even in water submergence. Therefore, the internal air pressure of the electric motor 10 becomes equal to the atmospheric pressure. As a result, it is possible to prevent inrush of water caused by the pressure difference between the inside and the outside. That is, in the configuration according to this embodiment, even when the power electric unit having a low mount position is submerged in water, a flow channel is provided between the gas (air) inside the unit and the atmosphere. Therefore, it is possible to prevent water from rushing into the unit.

According to this embodiment, the breather 33 is provided in the PDM 30 having the highest mount position out of the power electric units. Since the unit having such a position is not easily submerged in water compared to other units, water does not easily rush in from the breather 33. In addition, it is possible to prevent adherence of dirt or the like.

According to this embodiment, the breather 33 is provided only in the PDM 30 having the highest mount position out of the power electric units. That is, only a single breather 33 is provided. Therefore, it is possible to reduce costs.

The air can flow between three units in FIG. 1 through the channels 410 and 420. For this reason, an air leakage inspection for inspecting air leakage between the units and the channels after integrating the units can be performed only in a single time. In addition, in the air leakage inspection, it is checked whether or not there is leakage by injecting the air from the breather 33. In the structure discussed in JP 2009-201218 A, since the channel of the unit has a liquid-tight structure, it is necessary to inject the air from the breathers of each unit to each unit for the air leakage inspection after an assembly work. Therefore, the air leakage inspection is not completed through a single try.

The breather 33 may be provided in either the front or rear side of a vehicle. However, if the breather 33 is provided in the rear side of a vehicle, the PDM 30, the inverter 20, and the like serve as a wall, so that it is possible to suppress water splashed during a travel from being trapped in the breather 33. In addition, if the breather 33 is provided in the rear side of a vehicle, a risk of direct water pouring is reduced during high pressure washing for a motor room.

If the breather 33 has a film pervious to a gas but not pervious to a liquid, it is possible to preferably prevent a contaminant from being inputted to the inside of the unit through the breather 33.

The air heated by the heat of the stator 12 of the electric motor 10 and the like flows to the inverter 20 through the channel 410 as indicated by the arrow in FIG. 1. If the water cooling module 23 is arranged immediately over the channel 410, this air is cooled by the water cooling module 23. Therefore, it is possible to preferably prevent the hot air from flowing into the PDM 30.

Second Embodiment

Figure 2:
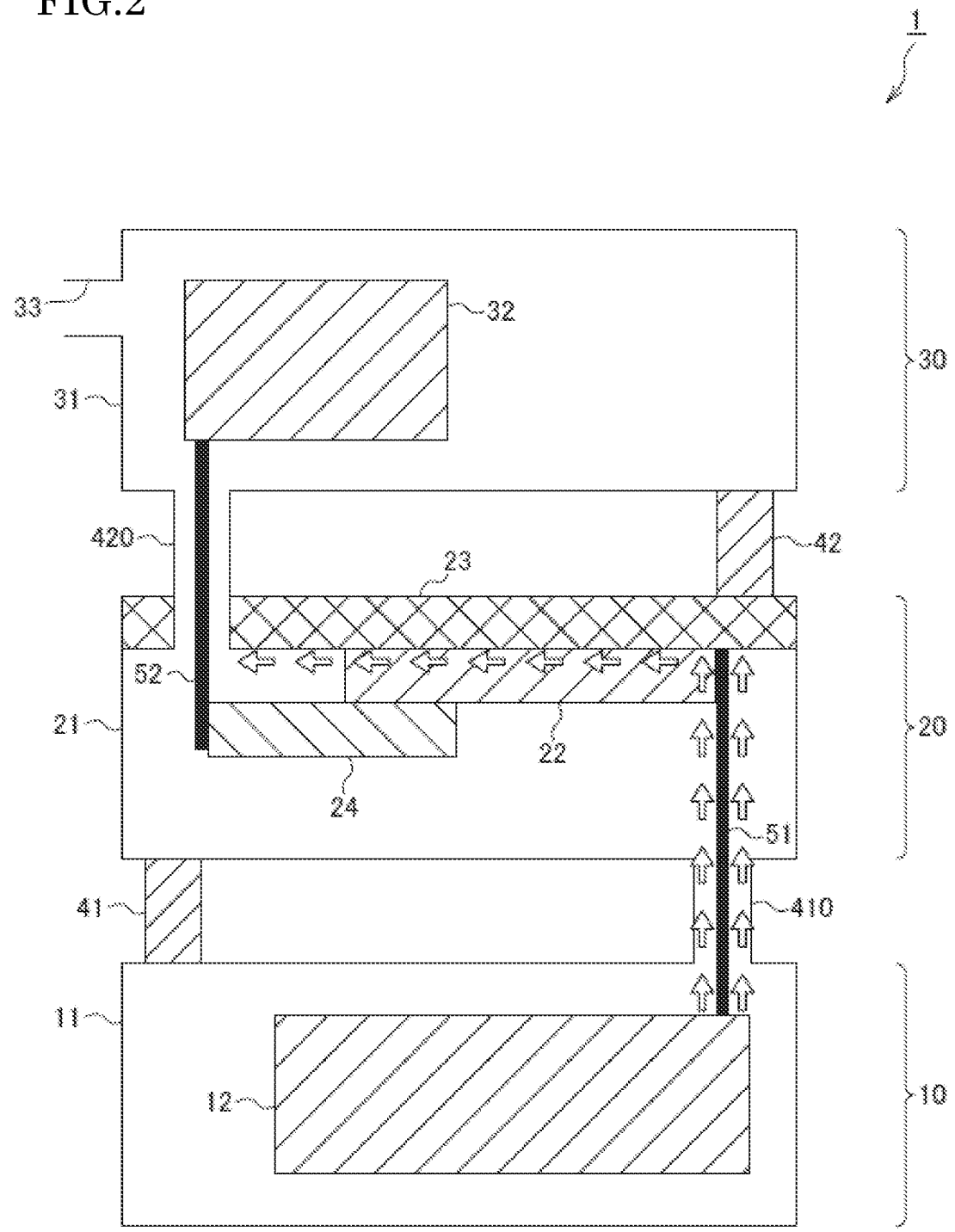
FIG. 2 is a schematic cross-sectional view illustrating an integrated power electric unit mounted on an electric vehicle according to a second embodiment.

FIG. 2 is a schematic cross-sectional view illustrating an integrated power electric unit mounted on an electric vehicle according to a second embodiment.

In the following description, like reference numerals denote like elements as in the aforementioned embodiment, and their descriptions will not be repeated.

In the first embodiment (FIG. 1), the channels 410 and 420 are arranged nearly coaxially. In comparison, according to the second embodiment, the channels 410 and 420 are arranged in opposite sides with respect to a line vertically passing through the inverter 20. In particular, in FIG. 2, the channel 410 is arranged in the vicinity of the right end, and the channel 420 is arranged in the vicinity of the left end.

According to this embodiment, the water cooling module 23 is arranged in the ceiling of the inverter casing 21. In addition, the power module 22 is arranged in the lower surface of the water cooling module 23, and the smoothing capacitor 24 is arranged in the lower surface of the power module 22.

In this configuration, the air heated by the heat of the stator 12 of the electric motor 10 and the like flows into the inverter 20 through the channel 410 as indicated by the arrow of FIG. 2 and is directed to the channel 420. In this case, in the structure according to the second embodiment, a distance flowing along the water cooling module 23 increases compared to the first embodiment. Therefore, it is possible to easily perform cooling.

In the structure according to the second embodiment, the air flow inside the inverter casing 21 is simplified compared to the first embodiment. Therefore, it is possible to reduce a pressure loss when the air flows inside the unit.

The integrated power electric unit mounted on the electric vehicle described above includes an inverter 20 and a PDM 30 arranged over the inverter 20 in a vertical direction of a vehicle. In addition, the integrated power electric unit includes a channel 420 that connects the inverter 20 and the PDM 30 so as to flow the air and a breather 33 provided in the PDM 30 to cause the inside and the outside of the PDM 30 to communicate with each other. As a result, since the breather 33 is provided in the PDM 30 positioned in the upper side, it is possible to prevent water from rushing in from the breather 33 even when the underlying inverter 20 is submerged in water.

Although embodiments of this invention have been described hereinbefore, they are just for illustrative purposes for embodying applications of this invention, and are not intended to limit the spirit and scope of the invention to the specific configurations of the embodiments.

For example, in the aforementioned description, the inverter 20 is arranged over the electric motor 10, and the PDM 30 is arranged over the inverter 20. However, such a vertical positional relationship is just exemplary. Another positional relationship may be possible.

Although the electric motor 10, the inverter 20, and the PDM 30 are exemplified as the power electric units, the invention is not limited thereto.

Although a case where three power electric units are integrated is exemplified in the aforementioned description, two power electric units may also be integrated, or four or more power electric units may also be integrated.

Naturally, the electric vehicle may include other vehicles such as a hybrid electric vehicle or a plug-in hybrid electric vehicle.

In addition, the embodiments described above may be appropriately combined.

This application is based on and claims priority to Japanese Patent Application Laid-open No. 2012-185210, filed in Japan Patent Office on Aug. 24, 2012, the entire content of which is incorporated herein by reference.

The invention claimed is:

1. An integrated power electric unit mounted on an electric vehicle, comprising:
   a first power electric unit;
   a second power electric unit arranged over the first power electric unit in a vertical direction of the vehicle;
   a first channel that connects the first and second power electric units so as to flow the air;
   a breather provided in the second power electric unit to cause inner and outer sides of the second power electric unit to communicate with each other;
   a third power electric unit arranged under the first power electric unit in a vertical direction of the vehicle;

a second channel that connects the first and third power electric units so as to flow the air; and a cooler arranged between the first and second channels.

2. The integrated power electric unit mounted on the electric vehicle according to claim 1, wherein:

the first power electric unit is an inverter;

the third power electric unit is an electric motor;

the cooler cools the power module of the inverter; and the power module is arranged in a lower surface of the cooler.

3. The integrated power electric unit mounted on the electric vehicle according to claim 1, wherein:

the cooler is arranged immediately over the second channel.

4. The integrated power electric unit mounted on the electric vehicle according to claim 1, wherein:

the first power electric unit is an inverter having a capacitor; and the capacitor is arranged over the cooler.

5. The integrated power electric unit mounted on the electric vehicle according to claim 1, wherein:

the first power electric unit is an inverter having a capacitor; and the capacitor is arranged to be horizontally separate from the second channel and is arranged to be separate from the cooler under the cooler.

6. The integrated power electric unit mounted on the electric vehicle according to claim 1, wherein:

the first and second channels are arranged in opposite sides with respect to a line vertically passing through the first power electric unit.

7. The integrated power electric unit mounted on the electric vehicle according to claim 2, wherein:

the second power electric unit includes a DC/DC converter and an electric charger.

\* \* \* \* \*